United States Patent [19]

Brown

[11] Patent Number: 5,101,310
[45] Date of Patent: Mar. 31, 1992

[54] MATCHED RECORD/PLAYBACK AGC AMPLIFIER SYSTEM

[75] Inventor: Kenneth M. Brown, Ledyard, Conn.

[73] Assignee: The United States of America as represented by the Secretary of the Navy, Washington, D.C.

[21] Appl. No.: 706,566

[22] Filed: May 28, 1991

Related U.S. Application Data

[63] Continuation-in-part of Ser. No. 149,285, Jan. 28, 1988, abandoned.

[51] Int. Cl.$^5$ .............................................. G11B 5/02
[52] U.S. Cl. ...................................................... 360/68
[58] Field of Search .................................. 360/67, 68

[56] References Cited

U.S. PATENT DOCUMENTS

| | | | |
|---|---|---|---|
| 3,379,839 | 4/1968 | Bennett | 360/27 |
| 3,657,489 | 4/1972 | Clark, Jr. | |
| 3,997,914 | 12/1976 | White | |
| 4,169,219 | 9/1979 | Beard | |

Primary Examiner—Vincent P. Canney
Attorney, Agent, or Firm—Michael J. McGowan; Prithvi C. Lall; Michael F. Oglo

[57] ABSTRACT

An automatic gain control (AGC) system to be used in record/playback mode wherein input signals over a wide dynamic range are recorded in the field. The recorded signals are then played back using the AGC system in order to recover the amplitudes of the original signals with high fidelity. The AGC system obtains record/playback gain reciprocity in the record and playback modes and thus effectively nullifies inherent gain control nonlinearity.

5 Claims, 5 Drawing Sheets

AGC STAGE GAIN vs. CONTROL VOLTAGE

MATCHED RECORD/PLAYBACK AGC AMPLIFIER SYSTEM

STATEMENT OF GOVERNMENT INTEREST

The invention described herein may be manufactured and used by or for the Government of the United States of America for governmental purposes without the payment of any royalties thereon or therefor.

This application is a continuation-in-part of application Ser. No. 07/149,285, filed Jan. 28, 1988, abandoned.

BACKGROUND OF THE INVENTION (1) Field of the Invention

Subject invention is related to electronic data processing systems and more particularly to a gain control signal processing system where data can be recorded and played back with high reproduction fidelity.

(2) Description of the Prior Art

Historically, sonar systems have had a need to acquire and store sonar signals for testing, processing and analyzing purposes. The wide amplitude dynamic range of such signals often necessitated the use of step-gain or manual-gain control amplifiers preceding the storage device, such as a conventional, commercially available tape recorder, in order to accommodate the limited recording dynamic range (50 dB or less) of the storage device. Limitations and disadvantages associated with such a gain control scheme are: (a) step-gain switching noise or signal saturation, especially when accompanying legitimate sonar signal echo reception; (b) requirement to annotate various record step-gain or manual-gain settings; (c) requirement to duplicate and utilize complementary or reciprocal gain settings in playback mode, often by using different amplifiers and amplifier characteristics from those used in record mode, in order to accurately recover amplitudes of the original signals. It is thus desirable to have a system to overcome the aforementioned sonar signal gain control limitations and disadvantages, especially for the case of acquisition, storage, and accurate reproduction of close-in signal returns in the presence of high-level reverberation.

SUMMARY OF THE INVENTION

An automatic gain control (AGC) scheme according to the teachings of subject invention employs a selectable integration time constant to adjust signal gain in accordance with the detected signal temporal envelope. The automatic, smooth transition of signal gain eliminates the aforementioned prior art instrumentation step-gain switching noise limitations. Real-time recording of the gain control signal also eliminates annotation requirements. The essence of this invention, however, is to automatically duplicate and utilize complementary or reciprocal gain control in playback mode in order to accurately recover amplitudes of the original signals in the field (i.e., at sea). Accordingly, the invention sets forth an AGC amplifier stage which, when incorporated in with other duplicate stages, a control, accurately and autonomously recovers system recorded input signals during data playback. This accurate signal reproduction over a significant dynamic range is achieved through the use of the same gain control device for both the amplification in record mode and the complementary attenuation in playback mode. Thus, dual use of the gain control device results in record/playback gain reciprocity and effective nullification of inherent gain control device nonlinearity.

An object of subject invention is to have a record/playback system which preserves the integrity of the recorded electrical signals over a wide dynamic range recorded in the field when the record is played back in the laboratory.

Another object of subject invention is to have a record/playback system for electronic signal processing which results in record/playback gain reciprocity.

Still another object of subject invention is to have a record/playback system which effectively nullifies inherent gain control and thereby improves signal reproduction fidelity.

Still another object of subject invention is to have a record/playback signal system which eliminates step-gain switching noise introduced during step-gain switching in order to cover a wide dynamic range of the signals to be recorded and played back.

Still another object of subject invention is to reduce circuit parts count by the dual use of AGC amplifier components in a reciprocal record/playback mode fashion.

Other objects, advantages and novel features of the invention may become apparent from the following detailed description of the invention when considered in conjunction with the accompanying drawings wherein:

DESCRIPTION OF A PREFERRED EMBODIMENT

Figure 1:
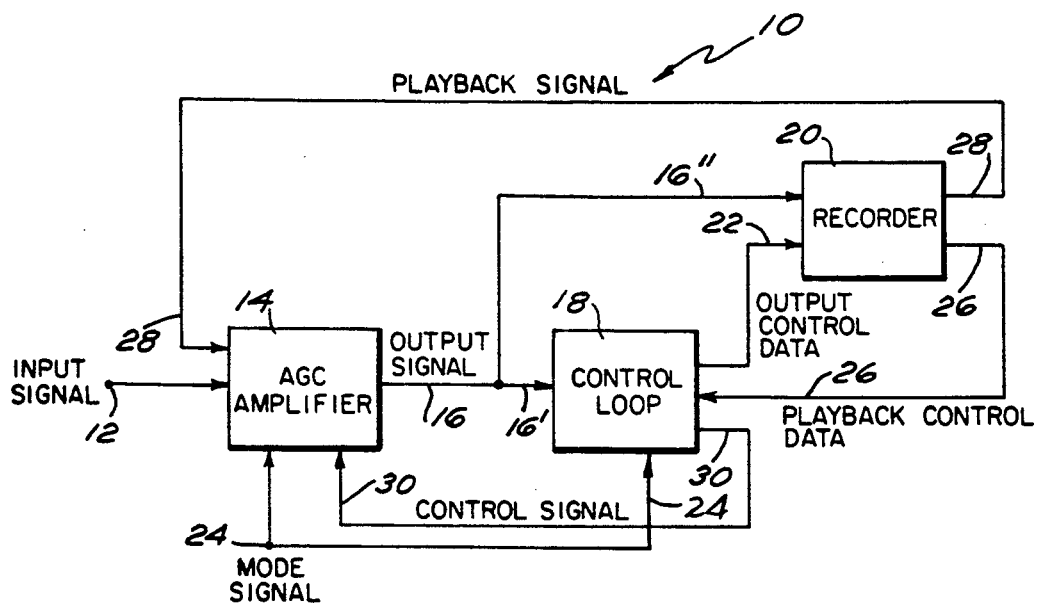
FIG. 1 is a block diagram of a record/playback system according to the teachings of subject invention.

Referring to the drawings wherein like reference characters designate identical or corresponding parts throughout the several figures and more particularly to FIG. 1 thereof, which is a block diagram showing the building blocks required to implement an automatic gain control record/playback system 10 for the storage and reproduction of analog signals. The analog signal input 12 is fed to AGC amplifier 14 having an output 16 thereof which is branched into inputs 16' and 16" to the control loop 18 and recorder 20 respectively. The AGC amplifier 14 comprises a plurality of channels to accommodate input signals which are of different amplitude. Branch 16' of signal output 16 of amplifier 14 is fed to control loop 18 and branch 16" thereof and output control data 22 are fed to recorder 20. Output 26 of recorder is fed into control loop 18 as playback control data 26 in playback mode and output 28 is fed into amplifier 14 as a playback signal 28 in playback mode. Mode signal 24 is fed into AGC amplifier 14 so as the system to be in either record mode or playback mode. Control signal 30 from control loop 18 is fed into AGC amplifier 14. Control loop 18 is a relatively conventional multi-channel AGC feedback loop comprised of the following processing functions: rectification, buffering, integration, amplification, multiplexing, sampling, quantization, formatting, deformatting, dequantization, demultiplexing and filtering. During real-time record mode feedback control signal 30 of control loop 18 adjusts the gain of AGC amplifier 14 so that the output signal of amplifier 14 is held to a minimum dynamic range over the record input signal level range. Conversely, during recorder playback mode, the output signal level of amplifier 14 is a reproduction of the original record input signal level as a result of reciprocal gain applied to the playback signal in amplifier 14 via the playback control data 26, control loop 18 and control signal 30.

Figure 1A:
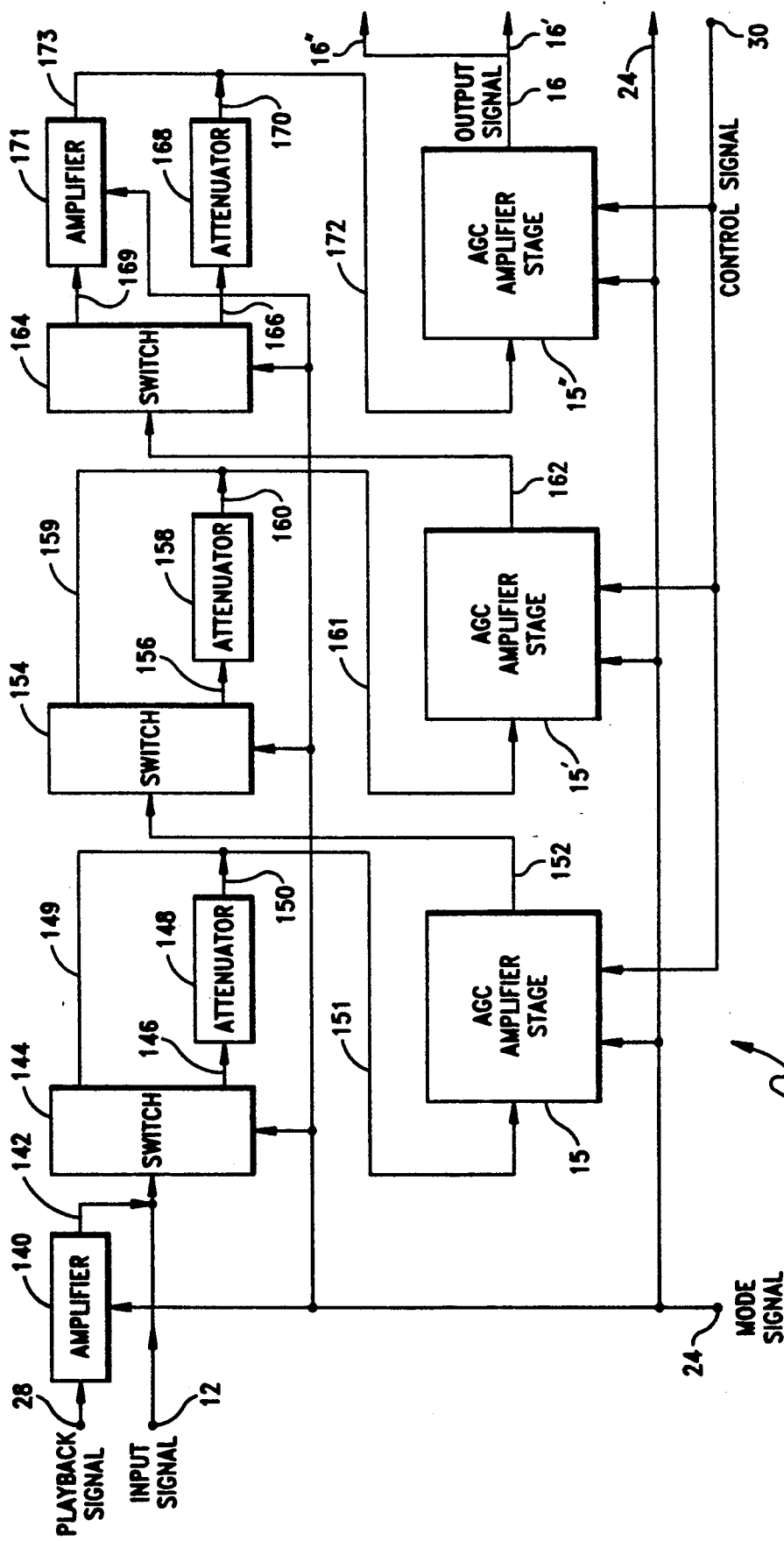
FIG. 1a is a block diagram of the record/playback AGC amplifier according to the teachings of subject invention.

The block diagram of FIG. 1a depicts the components of AGC amplifier 14 of FIG. 1. For the record operation, manually selectable mode signal 24 (+15 VDC) configures this subsystem as follows: playback amplifiers 140 and 171 are isolated by signal 24 from outputs 142 and 173, respectively; multiplexer switches 144, 154, and 164 connect their respective inputs to switch record outputs 146, 156, and 166, respectively; and AGC amplifier stages 15, 15' and 15" are set for record mode. Detailed operation of identical stages 15, 15', and 15" is described FIG. 2 below. In record mode, each of these three cascaded stages provides automatically, through feedback, variable signal gain from 0 dB to approximately +29 dB; total AGC amplifier 14 gain thus varies from 0 dB to +87 dB in record mode. These stage gains are applied to the record input signal 12 in conjunction with pre-stage fixed attenuation of −12 dB, −16 dB, and −16 dB from attenuators 148, 158, and 168, respectively. This preattenuation maintains proper interstage signal levels and operational linearity of AGC amplifier stages 15, 15', and 15". Control signal 30, generated in control loop 18 of FIG. 1, continuously adjusts the gains of amplifier stages 15, 15', and 15" to achieve an RMS voltage level of −30 dBV ±2 dBV for output signal 16. The output signal 16 variation is controlled by the loop gain of the feedback loop comprising AGC amplifier 14, control loop 18, and feedback control signal 30 of FIG. 1. Loop gain also controls transient signal response such that a design tradeoff with the ±2 dBV output signal variation gives a transient signal response of approximately 50 msec. for a step input signal 12 of approximately 1 volt RMS.

Figure 1B:
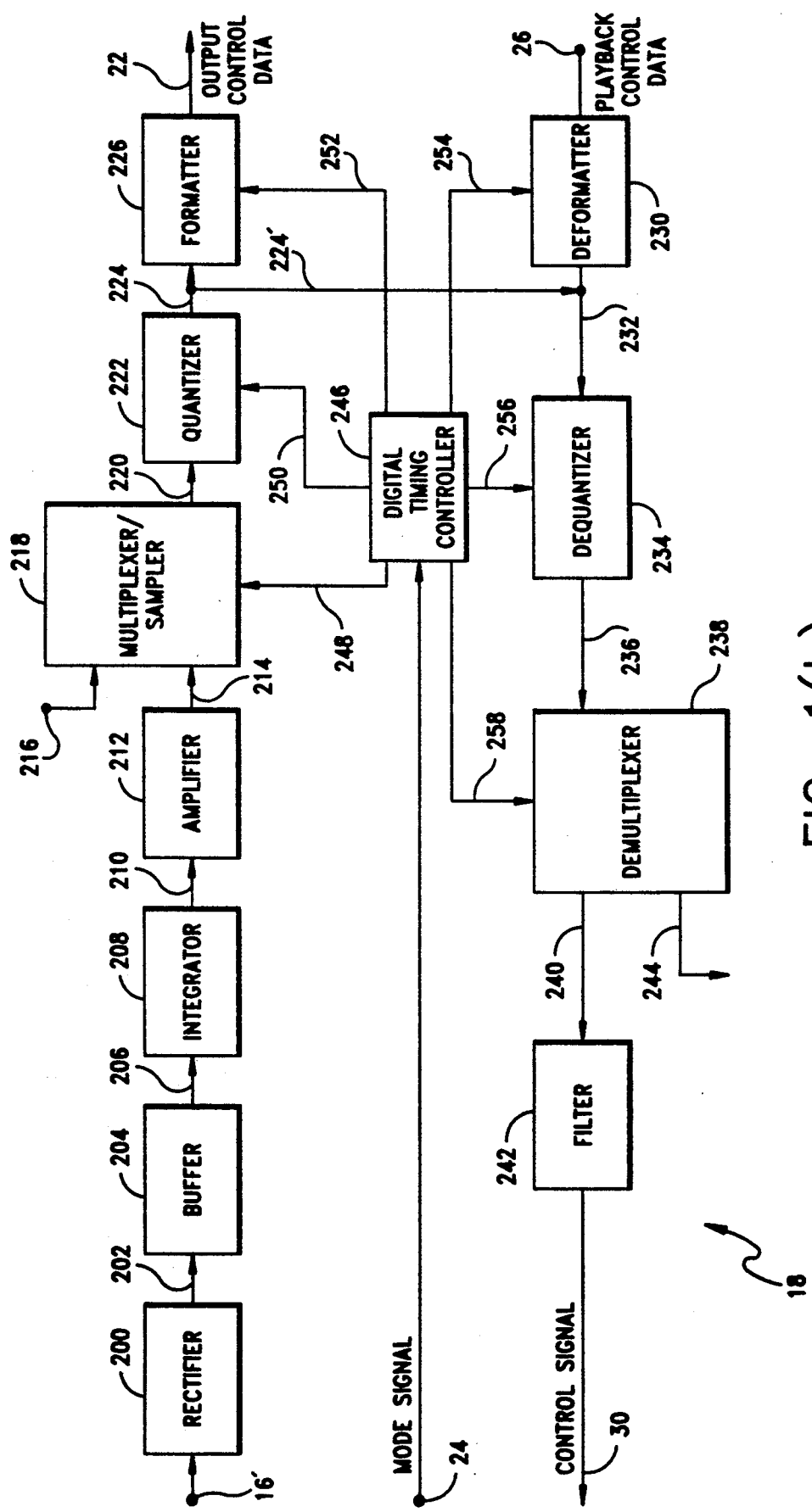
FIG. 1b is a block diagram of the record/playback AGC control loop according to the teachings of subject invention.

Analog output signal 16 of FIG. 1a branches into the signal 16" recorder 20 input of FIG. 1 and the signal 16' control loop 18 input of FIG. 1b. Signal 16" is recorded on a single track of recorder 20. Referring to FIG. 1b, input signal 16' to control loop 18 is first rectified by rectifier 200 to produce a unipolar negative analog control voltage signal 202. Voltage follower buffer 204 impedance matches signal 202 resulting in buffered control signal 206 which is integrated and inverted by integrator 208. The RC time constant of integrator 208 is preselected for the recording medium, e.g., a time constant of approximately 0.5 sec. is suitable for a typical sonar reverberation input signal temporal envelope. Thus, the level of recorded signal 16" is based on the time-averaged input signal 12 envelope via feedback control signal 30. AGC loop gain, as previously mentioned, allows for input transients to be recorded. Rectifier 200 and integrator 208 include gain and level adjustment means to set the level of AGC control signal 30 to properly achieve output signal 16" at −30 dBV for minimum input signal 12. Integrator output 210, now inverted to a positive voltage, is amplified by amplifier 212 which, like rectifier 200, has a gain adjustment means for scaling control signal 30. This scaling sets the voltage range of control signal 30 permitting the adjustment of the gain control devices (which may be FETs or the like, (see FIG. 4) of AGC amplifier stages 15, 15', and 15" of FIG. 1a. Amplifier 212's output signal 214, of which AGC control signal 30 is the negative replica, is digitally processed in the following manner. Multiplexer/sampler 218, under control of a logic signal 248 from digital timing controller 246, takes periodic time samples of AGC control signal 214. Digital timing controller 246 may be implemented as a general purpose digital computer, as an ASIC or as a single circuit card. Sample signal 220 is quantized to 11-bit digital words via quantizer 222, an analog-to-digital converter, under timing control form logic signal 250. Digital word signal 224 is formatted to serial form by formatter 226 under timing control of signal 252. Digital output control data 22 is recorded on a separate track of recorder 20 and in real-time time synchronization with its respective analog output signal 16". Multiplexer/sampler 218, quantizer 222, an formatter 226 can process additional control signals shown generally as 216 in a similar time-shared fashion as signal 214, if desired. Time samples would be taken for each of these additional AGC control signals for each of their respective analog channel inputs. This accommodates automatic gain control and recording/playback of other analog signals which are processed via each separate AGC amplifier 14, rectifier 200, buffer 204, integrator 208, and amplifier 212 combination.

Still in record mode, deformatter 230, via mode signal 24, digital timing controller 246, and logic signal 254, is isolated from deformatter output 232. Simultaneous with quantized signal 224 being processed by formatter 226, its identical branch signal 224' is dequantized to sample form by dequantizer 234, an 11-bit inverting digital-to-analog converter, under control of a timing signal 256 from digital timing controller 246. Sample signal 236 is demultiplexed, or separated, from the additional sample control signals 244 by demultiplexer 238 under timing control of signal 258. Demultiplexed time sample signal 240 is smoothed by RC filter 242 to recreate analog AGC control signal 214 in the form of the negative-voltage control signal 30 of FIG. 1b. Control signal 30 closes the AGC feedback loop to the AGC amplifier stages 15, 15', and 15" of FIG. 1a. Signal 30 autonomously adjusts the FET gain-control devices of each amplifier stage to regulate the 87 dB dynamic level of input signal 12, FIG. 1a, to a level of −30 dBV±2 dBV for output signal 16, to be recorded. Loop gain, as previously mentioned, is the product of the gains of AGC amplifier 14 (which is the product of the gains of its stages 15, 15', and 15"), rectifier 200, and amplifier 212. Loop gain and filter poles are selected such that the loop frequency response has negative feedback (i.e., phase less than 360 degrees) at the unity gain crossover. This assures loop stability while providing an acceptable tradeoff between output signal 16 variation (±2 dBV) and transient signal response (approximately 50 msec.), as previously discussed.

For playback operation, manually selected mode signal 24 (−15 VDC) of FIG. 1a configures the AGC amplifier 14 as follows: playback amplifiers 140 and 171 are connected to outputs 142 and 173, respectively; multiplexer switches 144, 154, and 164 connect their respective inputs to switch playback outputs 149, 159, and 169, respectively; and AGC amplifier stages 15, 15', and 15" are set for playback mode (see FIG. 2 description). In playback mode, each of these three cascaded stages provides automatically variable signal gain from 0 dB to approximately −29 dB, i.e., in precisely the dual-gain fashion as occurred in record mode via re-use of the record-generated control signal 30. Referring to FIG. 1b, the quantized and recorded version of analog AGC control signal 214, i.e., output control data 22, is played back (along with analog playback signal 28) as playback control data 26. Via mode signal 24 and logic signal 250, quantizer 222 is isolated from its output branch 224' in playback mode. Conversely, logic signal 254 connects deformatter 230 to deformatter output 232, allowing deformatted playback control data 26 to be dequantized via dequantizer 234, demultiplexed via signal 236 and demultiplexer 238, and smoothed via sample signal 240 and filter 242. Resultant control signal 30, now recreated in playback mode, is the duplicate of that generated in record mode and is in synchronization with its input playback signal 28 of FIG. 1a. Through dual and reconfigured use of the AGC amplifier stages 15, 15', and 15", including the dual and reconfigured use of each stage's nonlinear gain-control devices (FET's), playback processing of playback signal 28 reproduces the original record input signal 12. The total, autonomously variable, playback gain for AGC amplifier stages 15, 15', and 15" covers the range from 0 dB to −87 dB. Playback amplifier stage gains are applied to playback signal 28 in conjunction with pre-stage fixed amplification of +20 dB and +24 dB from amplifiers 140 and 171, respectively. This pre-amplification maintains proper interstage signal levels and operational linearity of AGC amplifier stages 15, 15', and 15". In playback mode, attenuator outputs 150, 160, and 170 are effectively disconnected from attenuators 148, 158, and 168, respectively, via drive disconnections 146, 156, and 166. AGC processing of the playback signal 28 level of −30 dBV±2 dBV (RMS), under control of replicated control signal 30 and reconfigured dual use AGC amplifier 14, reproduces the original record input signal 12 over its 87 dB dynamic range as (playback) output signal 16.

Figure 2:
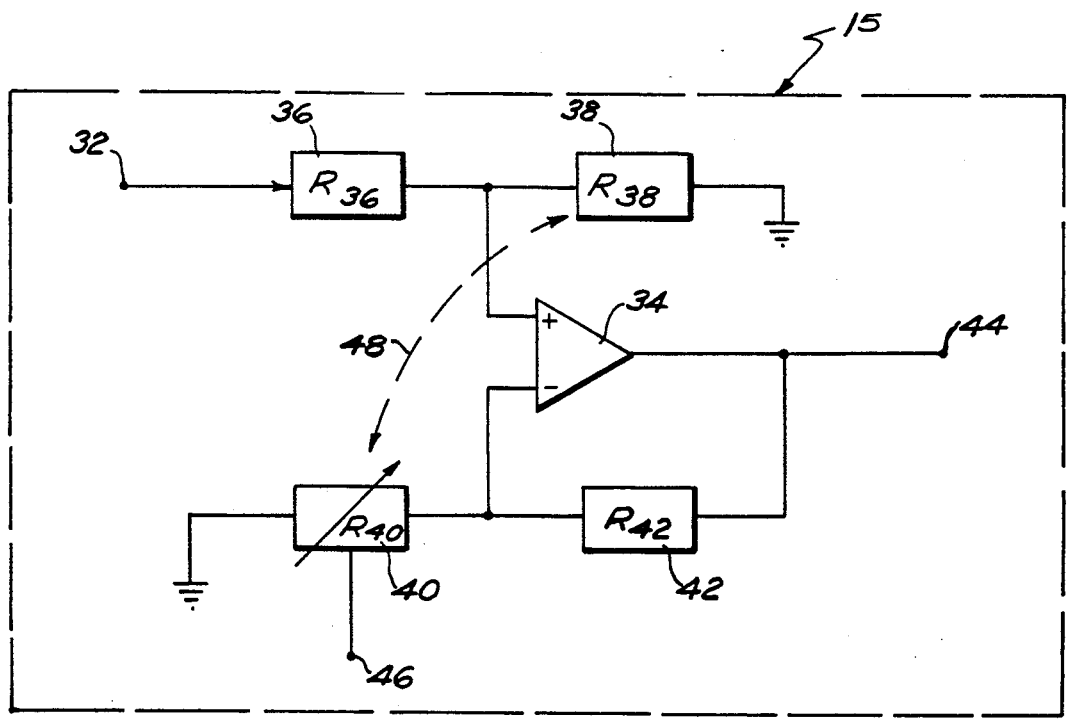
FIG. 2 is a block diagram of a general non-inverting feedback amplifier stage explaining the concept used in the dual record/playback mode.

The block diagram of FIG. 2 represents the basic feedback amplifier stage which is useful to conceptualize the invention. Record (or playback) signal input 32, representing either signal 12 (record mode), or signal 28 (playback mode) is processed by amplifier 34 under the constraints of the input network comprising of resistor 36 or ($R_{36}$) and resistor 38 or ($R_{38}$), and the feedback network comprising variable resistor 40 or ($R_{40}$) and resistor 42 or ($R_{42}$). Stage voltage gain is the ratio of output voltage 44 to input voltage 32, under the control of the AGC feedback control voltage 46 which is developed in control loop 18 of FIG. 1. Control voltage 46 adjusts AGC stage gain by changing the variable portion of gain control resistance 40 or ($R_{40}$). The classical amplifier stage of FIG. 2 becomes a unity gain stage if resistance 42 or ($R_{42}$) equals resistance 36 or ($R_{36}$) and resistance 40 or ($R_{40}$) equals resistance 38 or ($R_{38}$). If resistance 42 or ($R_{42}$) and resistance 36 or ($R_{36}$) are equal, stage gain is greater than unity (i.e., signal amplification occurs) if resistance 40 or ($R_{40}$) is less than resistance 38 or ($R_{38}$). Conversely, stage gain is less than unity (i.e., signal attenuation occurs) if resistance 38 or ($R_{38}$) is less than resistance 40 or ($R_{40}$). When such a feedback amplifier stage is used as part of a signal recording amplifier, record/playback gain reciprocity can be defined as the complementary function relating record and playback stage gains. In other words, record/playback gain reciprocity exists if, for any value of the AGC stage control voltage 46, playback gain is the reciprocal value of record gain. As described, if AGC gain reciprocity exists, then amplitudes of automatic gain controlled recording system signal inputs can be precisely recovered in playback mode through the reconfigured AGC amplifier stage. A method was therefore needed to switch the AGC variable portion of resistance 40 or ($R_{40}$) in record mode to become the AGC variable portion of resistance 38 or ($R_{38}$) in playback mode. This AGC amplifier stage record/playback reciprocal gain switching is symbolically shown by the function represented by dotted line and arrow combination 48 of FIG. 2.

Mathematically, overall record/playback system gain is simply defined as (where V=voltage, A=gain, i=input, o=output, r=record, p=playback):

$$\frac{V_{op}}{V_{ir}} = \left(\frac{V_{op}}{V_{ip}}\right)\left(\frac{V_{ip}}{V_{ir}}\right) = \left(\frac{V_{op}}{V_{ip}}\right)\left(\frac{V_{or}}{V_{ir}}\right) = A_p A_r$$

since the playback input signal to the AGC stage is synonomous to the stage's output signal recorded on magnetic tape, assuming good recorder fidelity.

For reciprocity to be maintained between record and playback modes, and therefore to recover the original gain controlled input record signal amplitude during gain controlled playback, we have:

$$V_{op} = V_{ir}$$

$$\frac{V_{op}}{V_{ir}} = 1 = A_p A_r$$

$A_p = A_r^{-1}$ (AGC record/playback reciprocity condition). Or, alternately stated in decibels:

$$A_p(\text{db}) = 20\log\frac{V_{op}}{V_{ip}} = 20\log\frac{V_{ir}}{V_{or}} = -20\log\frac{V_{or}}{V_{ir}} = -A_r(\text{db})$$

With application to an actual record/playback AGC amplifier stage, as shown in FIG. 2, record gain is defined as:

$$A_r = \frac{V_{or}}{V_{ir}} =$$

$$\left(\frac{R_{38}}{R_{36}+R_{38}}\right)\left(1+\frac{R_{42}}{R_{40}}\right) = \left(\frac{R_{38}}{R_{36}+R_{38}}\right)\left(\frac{R_{40}+R_{42}}{R_{40}}\right)$$

For the case of the same amplifier used in playback mode with resistor 42 or ($R_{42}$) interchanged with resistor 36 or ($R_{36}$) and resistor 40 or ($R_{40}$) interchanged with resistor 38 or ($R_{38}$), playback gain $A_p$ is given by:

$$A_p = \frac{V_{op}}{V_{ip}} = \left(\frac{R_{40}}{R_{40} + R_{42}}\right)\left(\frac{R_{36} + R_{38}}{R_{36}}\right) = A_r^{-1}$$

Therefore, to implement the previously-derived record/playback reciprocity condition using the amplifier stage of FIG. 2, the resistors need not be equal but only switched in roles in order to achieve reciprocal gain between record and playback modes. This is true even if one resistor is variable, as in the case of a field-effect transistor (FET) in an AGC amplifier application. If resistor 42 or ($R_{42}$) and resistor 36 or ($R_{36}$) are equal and if the fixed portions of resistor 40 or ($R_{40}$) and resistors 38 or ($R_{38}$) are equal, then only the variable (FET) portion of resistor 40 or ($R_{40}$) in record mode needs to be switched to become the variable portion of resistor 38 or ($R_{38}$) in playback mode to obtain gain reciprocity. Again, the function represented by dotted line and arrow combination 48 of FIG. 2 symbolizes this switching effect.

In review, whether the above analysis is applied to the overall record/playback system or to a single record/playback AGC amplifier stage, incorporation of gain reciprocity will assure the recovery of AGC amplifier 14 of FIG. 1 record input signal amplitude during playback mode This signal duplication is an important requirement for nonreal-time sonar signal processing, analysis, and system testing. For example, if AGC amplification is needed for a set amplifier signal output level with a particular record input amplitude, then the same reciprocal amplification (i.e., attenuation) is needed in playback mode in order to recover the original record input amplitude. This can be, and has been, done in the past with step-gain or manual-gain control, with resultant problems alluded to in the Background of the Invention. The innovation of the matched record/playback AGC amplifier stage is that gain reciprocity between record and playback modes is automatically maintained, even while using a nonlinear gain control device such as a FET. It can be clearly shown that FET channel resistance is not linearly related to FET gate voltage. When the FET is used as the amplification control device in the feedback network of an AGC amplifier stage during signal recording, and then switched to act as the attenuation control device in the amplifier input network during playback, gain reciprocity occurs. Stage gain vs. control voltage nonlinearity is thereby nullified, resulting in the autonomous recovery of system input signal amplitude.

Figure 3:
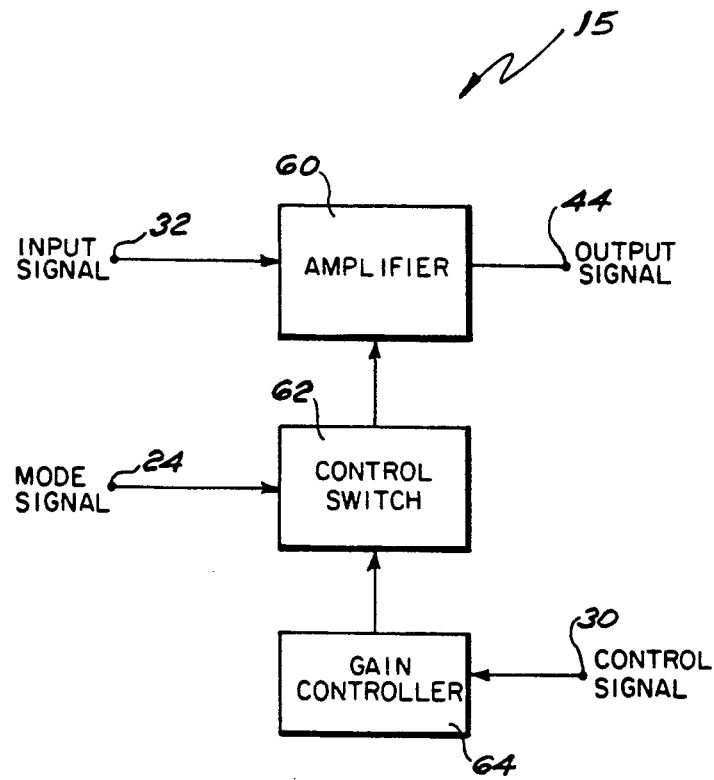
FIG. 3 is a block diagram showing the building blocks required to implement a single matched record/playback AGC amplifier stage.

FIG. 3 diagrammatically shows the basic building blocks required to implement a single matched record/playback AGC amplifier stage. Amplifier 60 is a basic operational amplifier configured with input, output, feedback and power supply filter networks Output 44 is the amplifier-processed voltage of input 32 as governed by the gain controller 64. The latter is an FET, and associated network, whose channel resistance is controlled by the AGC control signal 30 which is derived in control loop 18 of FIG. 1. Finally, control switch 62 comprises a pair of switching FETs; selection of conduction of a particular switching FET is made by manual application of mode signal 24 in accordance with the required system operational mode, i.e., record or playback. In this manner, the FET of gain controller 64 is electrically switched to the inverting (feedback) or non-inverting (input) node of the operational amplifier 60, in accordance with the selection of record or playback mode, respectively.

Figure 4:
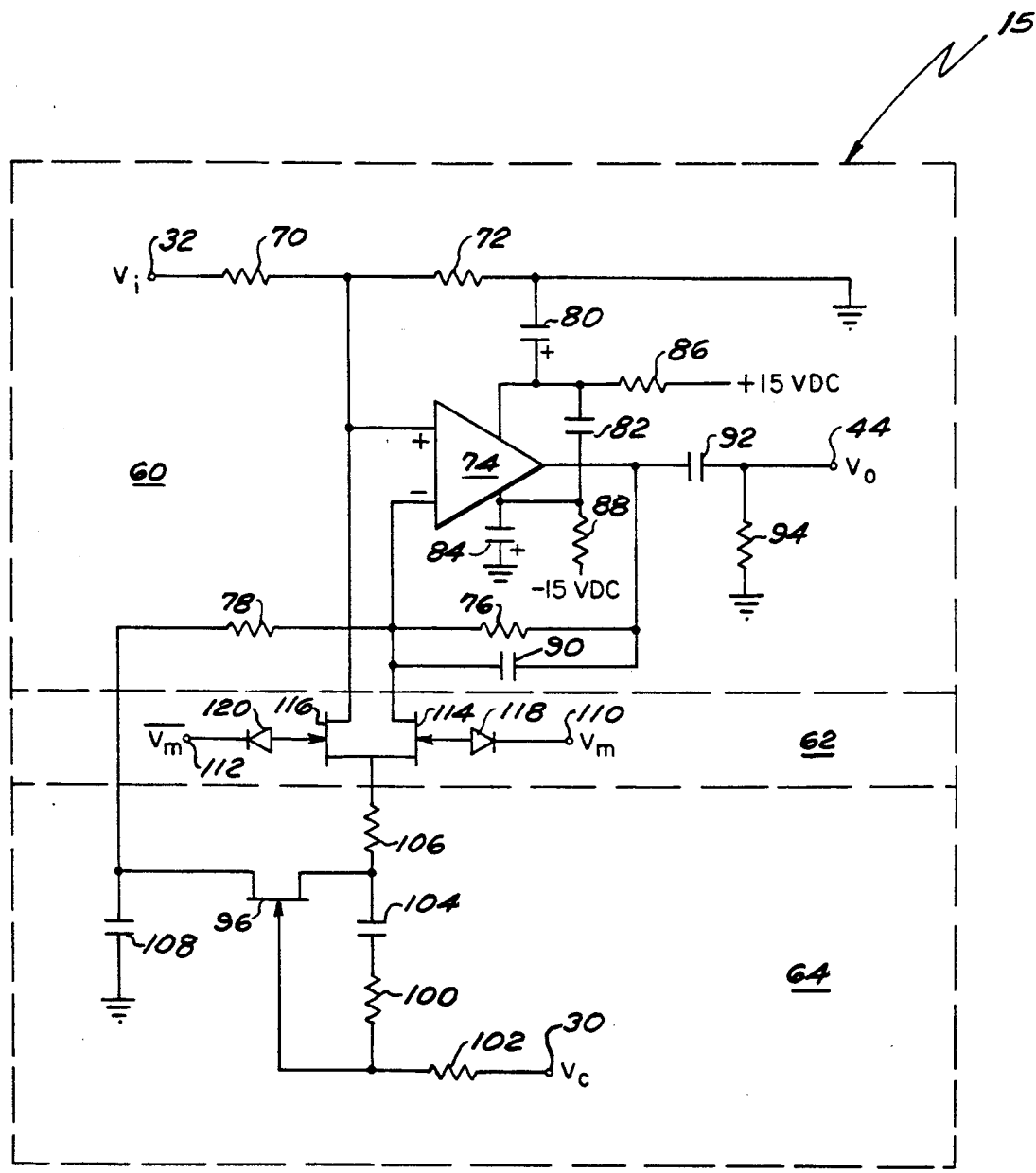
FIG. 4 is the schematic of the matched record/playback AGC amplifier stage of subject invention.

FIG. 4 is the design schematic of the matched record/playback AGC amplifier stage. Depending on system mode of operation, record or playback, input node 32 is fed an analog signal from either a sonar receiver for recording or from the system recorder for playback and recovery of the original sonar signal. Resistors 70 or ($R_{70}$) and 72 or ($R_{72}$) form an input attenuation network designed to avoid stage signal saturation in operational amplifier 74 over the dynamic input signal range of the stage. Resistor 76 or ($R_{76}$) provides negative amplifier feedback, and, in conjunction with resistor 78 or ($R_{78}$), sets the static amplification factor of the stage. Capacitors 80, 82 and 84, in conjunction with resistors 86 and 88 provide supply voltage filtering. Capacitor 90, along with feedback resistor 76 or ($R_{76}$) sets the high frequency roll-off response point; this reduces amplifier output noise while also avoiding any significant phase-shift of passband signals. Capacitor 92 and resistor 94 set the low frequency roll-on point for interstage decoupling. Stage gain control signal 30, derived from the AGC control loop 18 of FIG. 1, adjusts the gate-to-source voltage and channel resistance of FET 96; during record mode, this adjustment is such that the output voltage 44 of the stage remains at a minimum dynamic range over the relatively wide dynamic range of stage input signal 32. Amplitude variations of output voltage 44 from the set level are detected by the control loop 18 and corrected by adjustment of FET 96 channel resistance via control signal 30.

In record mode, then, FET 96 channel resistance is the variable portion of resistor 40 or ($R_{40}$) depicted in FIG. 2. Record stage amplification is thus automatically variable and equated to the sum of unity plus the ratio of resistor 76 or ($R_{76}$) to the parallel combination of resistor 78 or ($R_{78}$) and FET 96 channel resistance ($r_{96}$). Record stage attenuation is the ratio of resistor 72 or ($R_{72}$) to the sum of resistors 70 or ($R_{70}$) and 72 or ($R_{72}$). Overall record stage gain ($A_r$) is the product of record stage amplification and attenuation:

$$A_r = \left(1 + \frac{R_{76}}{R_{78}//r_{96}}\right)\left(\frac{R_{72}}{R_{72} + R_{70}}\right)$$

where $R_{78}//r_{96}$ means $R_{78}$ in parallel with $r_{96}$ and has a value of $(r_{96})(R_{78})/(r_{96} + R_{78})$.

FET channel resistance linearity and drain-to-source signal distortion are substantially improved by feeding back a portion of the drain-to-source voltage to FET 96 gate. Resistors 100 and 102 achieve this goal. Capacitor 104 blocks control signal 30 from FET 96 drain and amplifier 74 inputs. Resistor 106, in series with FET 96 channel resistance, sets the desired maximum record stage gain. Capacitor 108 constrains DC stage gain to unity to minimize DC offset. An external manual input applies +15 VDC to mode signal 110 and −15 VDC to complement mode signal 112 during record mode. This action yields a virtually direct connection, via 7 ohms max. FET 114 channel resistance, of the series resistance 106 and FET 96 channel resistance to amplifier 74 inverting input. This series resistance, then, is effectively connected in parallel to resistor 78 or ($R_{78}$), providing variable record mode positive stage gain in accordance with control signal 30 Conversely, the channel resistance of cutoff FET 116, except for negligible leakage current, provides isolation between amplifier 74 inputs in record mode. Diode 118 provides record mode gate isolation for FET 114, yielding a floating gate and resultant improved linearity for low values of drain-to-source voltage.

During playback mode, complement mode input signal 112 is +15 VDC and mode signal 110 is −15 VDC; this modality yields a virtually direct connection, via 7 ohms max. FET 116 channel resistance, of the series resistance 106 and FET 96 channel resistance to amplifier 74 non-inverting input. This series resistance, then, is effectively AC-connected in parallel to resistor 72 or ($R_{72}$), providing variable playback mode negative stage gain in accordance with control signal 30. Capacitor 108 is sufficiently large to effect this AC connection to resistor 72 or ($R_{72}$) over the signal passband of interest. Diode 120 provides playback mode gate isolation for improved linearity of FET 116. Channel resistance of cutoff FET 114 provides excellent isolation between amplifier 74 inputs in playback mode. In playback mode, then, FET 96 channel resistance is the variable portion of resistor 38 or ($R_{38}$), since the switched function depicted as dotted line arrow combination 48 in FIG. 2 is implemented Playback stage attenuation is thus automatically variable and equated to the reciprocal of the sum of unity and the ratio of resistor 70 or ($R_{70}$) to the parallel combination of resistor 72 or ($R_{72}$) and FET 96 channel resistance. Playback stage amplification is the reciprocal of the ratio of resistor 78 or ($R_{78}$) to the sum of resistors 78 or ($R_{78}$) and 76 or ($R_{76}$). Overall playback stage gain ($A_p$) is the product of playback stage attenuation and amplification:

$$A_p = \left( \frac{R_{72}//r_{96}}{R_{72}//r_{96} + R_{70}} \right)\left( 1 + \frac{R_{76}}{R_{78}} \right) =$$

$$\left( 1 + \frac{R_{70}}{R_{72}//r_{96}} \right)^{-1} \left( \frac{R_{78}}{R_{78} + R_{76}} \right)^{-1} = A_r^{-1}$$

This reciprocal gain equality is made within the design constraint of ±1% resistor tolerance for resistors 70 or ($R_{70}$) and 76 or ($R_{76}$) being equal and resistors 72 or ($R_{72}$) and 78 or ($R_{78}$) being equal Again manifesting record/playback duality, resistor 106, in series with FET 96 channel resistance, sets the desired minimum playback stage gain (i.e., maximum playback stage attenuation).

With the design ratio of resistor 72 or ($R_{72}$) to resistor 70 or ($R_{70}$) small, providing 27 db attenuation of input signal 32, FET 96 drain-to-source voltage is less than ±60 mv (−27 dbv) for inputs less than 0 dbv. This minimal drain-to-source voltage across gain control FET 96 maintains channel resistance in its most linear region and prevents signal distortion during both record or playback. Additional stage pre-attenuation, of course, allows for application of input signals greater than 0 dbv while still retaining FET and AGC linearity.

Figure 5:
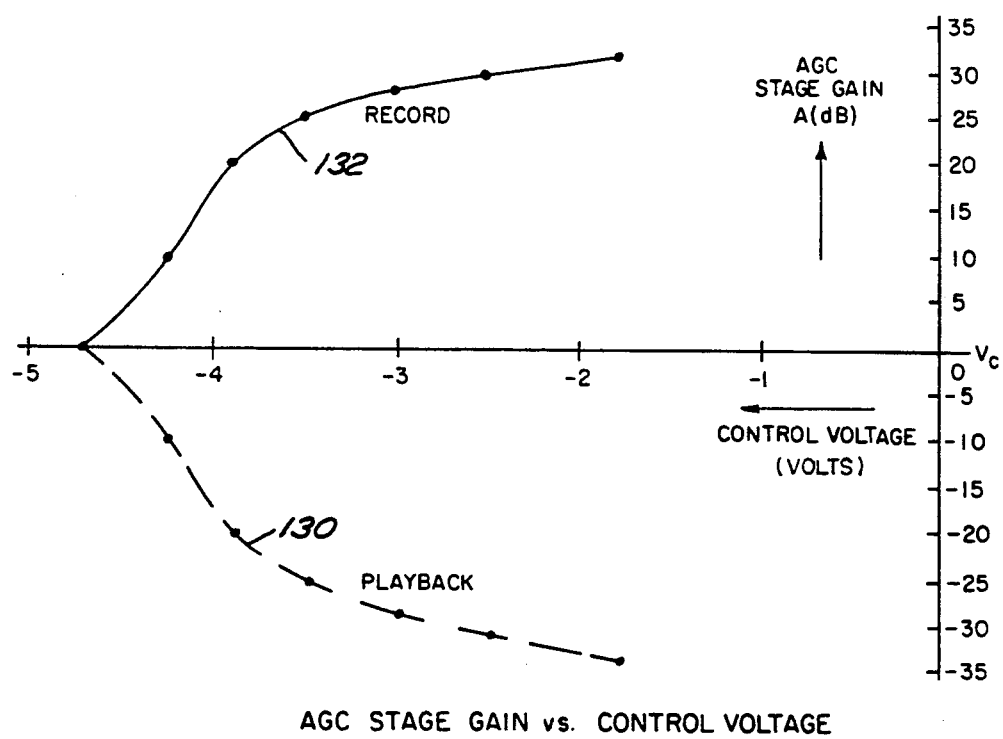
FIG. 5 is a plot of a matched record/playback AGC amplifier stage gain vs. control voltage for a system built according to the teachings of subject invention.

AGC stage gain vs. control voltage is plotted in FIG. 5 using emperical data from a prototype record/playback AGC amplifier stage. The playback mode plot (dashed curve 130) is a virtual mirror image of the record mode plot (solid curve 132) about the axis of abscissas, thus depicting the subject invention's ability to inherently nullify gain nonlinearity on a record/playback basis. The symmetry of this record/playback gain reciprocity is within 0.1 db error (1.1%) for stage gains up to ±21 db and 0.2 db error (2.3%) for ±22 db gain. These figures are commensurate to a design utilizing ±1% resistors in the amplifier input and feedback networks, as shown by mathematical circuit analysis. Tighter resistor tolerance would clearly mitigate record/playback gain reciprocity error. Other possible sources of reciprocity error are operational amplifier differential input and gain characteristics, and slight characteristic mismatch of control switches For the total system implementation of FIG. 1, recorder infidelity may also introduce some record/playback gain reciprocity error.

Briefly stated, an automatic gain control (AGC) amplifier stage configurable for both record and playback modes according to the teachings of subject invention employs a selectable integration time constant to adjust signal gain in accordance with the temporal envelope of the detected signal. It includes a control circuit which provides feedback to the AGC amplifier either from the detected record signal in real-time or from the playback control data signal, depending upon the mode in which the system is operating. The AGC amplifier incorporates several amplifier stages and detection circuits which accurately reproduce a signal of wide dynamic range from the playback data signal by using the same gain control device for both amplification in record mode and complementary attenuation in playback mode. This approach results in record/playback gain reciprocity and 24 effective nullification of inherent gain control nonlinearity. All of FIG. 1 except recorder 20 may be implemented on a single circuit card which may be used with one recorder in the field and a second recorder later back in the lab.

Modification and variation in the present invention are possible in light of the above teachings. As an example, the tolerances of the electronic components such as resistors and capacitors can be narrowed to reduce mismatch of the reciprocity characteristics of the circuit. Furthermore, the control loop circuit can be modified to accomplish the same results. It is therefore to be understood that within the scope of the appended claims the invention may be practiced otherwise than as specifically described.

What is claimed is:

1. A method for recording a plurality of electrical signals and playing back the recorded signals with high fidelity while incorporating dual use of an automatic gain control (AGC) amplifier unit interfaced with a control unit, a recorder unit and means for controlling record/playback mode, said method comprising the steps of:
   selecting record mode of said means for controlling record/playback mode;
   autonomously adjusting the gain of said AGC amplifier unit to record said plurality of electrical signals over a wide dynamic range thereof;
   generating a sequence of gain control words simultaneously corresponding to each recorded signal of said plurality of electrical signals;
   selecting playback mode of said means for controlling record/playback mode; and
   autonomously adjusting the gain of said AGC amplifier unit in the playback mode for the gain of said AGC amplifier unit to be complementary to the gain thereof in the record mode for each recorded signal of said plurality of electrical signals.

2. The method of claim 1 wherein the dual use of said AGC amplifier unit in recording of said plurality of electrical signals and playing back the recorded signals further include the steps of nullifying of the gain control nonlinearity of the AGC amplifier unit thereby reducing parts count and improving signal reproduction fidelity by circumventing the inaccurate process of exactly matching separate gain control devices and amplifier components as required when producing separate AGC amplifiers, one each for record mode and playback mode.

3. A matched record/playback AGC amplifier system, comprising:

recording means for controllably receiving and playing back selected acoustic signals;

AGC amplifier means, connected to said recording means, for receiving and amplifying said acoustic signals and outputting said amplified acoustic signals to said recording means;

control loop means, connected to said recording means and said AGC amplifier means, for receiving said output signal from said amplifier means and varying the gain of said AGC amplifier means, said variable gain signal also being recorded simultaneously with said acoustic signals; and mode switching means, connected to said AGC amplifier means and said control loop means, for producing mode signals to control the record/playback mode of said recording means, said playback mode reproducing said acoustical signal including said recorded variable gain effects thereby nullifying the non-linear effects of said AGC amplifier means.

4. The system of claim 3 wherein said AGC amplifier means further comprises:

a playback signal amplifier, connected to said recording means, for receiving and amplifying a playback signal therefrom;

a first switching means, connected to said playback signal amplifier and to said input signal, for selecting one of said input signal or said playback signal upon command of said mode signal;

a first AGC amplifier stage means, connected to said first switching means, for receiving and amplifying the output thereof;

a second switching means, connected to the output of said first AGC amplifier stage means, for receiving the output thereof and selecting record or playback upon command of said mode signal;

a second AGC amplifier stage means, connected to said second switching means, for receiving and amplifying the output thereof;

a third switching means, connected to the output of said second AGC amplifier stag means, for receiving the output thereof and selecting record or playback upon command of said mode signal; and a third AGC amplifier stage means, connected to said third switching means and to said recording means, for receiving and amplifying the output of said switching means and transmitting said amplified signal to said recording means.

5. The system of claim 4 wherein said control loop means further comprises:

a rectifier means, connected to said output of said third AGC amplifier stage means, for rectifying said signal to produce a unipolar negative analog control voltage signal therefrom;

a voltage follower buffer means, connected to the output of said rectifier means, for impedance matching the rectifier output signal so as to produce a buffered analog control signal therefrom;

an integrator means, connected to the output of said voltage follower buffer means, for receiving the buffered analog signal therefrom and integrating over a preselected RC time constant to produce and inverted, positive, time averaged output signal therefrom;

a control loop amplifier means, connected to said integrator means, for receiving and amplifying the output signal thereof;

a multiplexer/sampler means, connected to said control loop amplifier means, for receiving the analog output thereof and controllably producing a sampled analog output signal therefrom;

quantizer means, connected to said multiplexer/sampler means, for receiving the output signal therefrom and controllably quantizing said analog signal into an 11 bit digital word signal;

formatter means, connected to said quantizer means and said recording means, for receiving the digital word signal therefrom and controllably formatting said digital word signal in serial form as output control data for recording on a separate track of said recording means in real-time synchronization with said recorded amplifier means signal;

digital timing controller means, connected to said multiplexer/sampler means, said quantizer means, said mode signal and said formatter means, for sequentially controlling the operation thereof according to a preselected timing sequence;

deformatter means, connected to said recording means and to said digital timing controller means, for receiving playback control data from said recording means and controllably deformatting said playback control data;

dequantizer means, connected to said quantizer means, said digital timing controller means and said deformatter means, for controllably dequantizing said playback control data digital signals and said quantizer output digital signals received therefrom into corresponding analog signals;

demultiplexer means, connected to said digital timing controller means and said dequantizer means for controllably combining said analog output signals therefrom into a control signal; and filter means, connected to said demultiplexer means and said AGC amplifier means, for smoothing said control signal.

* * * * *